(12) United States Patent
Nedovic

(10) Patent No.: US 8,766,746 B2
(45) Date of Patent: Jul. 1, 2014

(54) ACTIVE INDUCTOR

(75) Inventor: Nikola Nedovic, San Jose, CA (US)

(73) Assignee: Fujitsu Limited, Kawasaki-shi (JP)

( * ) Notice: Subject to any disclaimer, the term of this patent is extended or adjusted under 35 U.S.C. 154(b) by 44 days.

(21) Appl. No.: 13/239,240

(22) Filed: Sep. 21, 2011

(65) Prior Publication Data

US 2013/0069165 A1 Mar. 21, 2013

(51) Int. Cl.
*H03H 11/00* (2006.01)
*H03H 11/48* (2006.01)

(52) U.S. Cl.
USPC ............................................ 333/213; 333/214

(58) Field of Classification Search
USPC .......................... 333/214, 215, 213; 327/581
See application file for complete search history.

(56) References Cited

U.S. PATENT DOCUMENTS

| 6,734,767 | B2 * | 5/2004 | Vanoverschelde et al. ... | 333/214 |
|---|---|---|---|---|
| 6,737,944 | B2 * | 5/2004 | Kunikiyo ...................... | 333/214 |
| 7,453,315 | B2 * | 11/2008 | Ravezzi et al. ............... | 327/581 |
| 7,512,389 | B2 | 3/2009 | Desclos | |
| 7,541,882 | B2 | 6/2009 | Ahmed | |
| 7,560,957 | B2 | 7/2009 | Chen | |
| 7,567,332 | B2 | 7/2009 | Chen et al. | |
| 7,656,255 | B2 | 2/2010 | Abel | |
| 7,756,500 | B1 | 7/2010 | Fulga | |
| 7,880,568 | B2 | 2/2011 | Amin | |
| 2006/0284682 | A1 * | 12/2006 | Lee et al. ...................... | 330/291 |
| 2010/0039192 | A1 * | 2/2010 | Schmitz et al. ............... | 333/215 |

OTHER PUBLICATIONS

Akbari-Dilmaghani, R. et al., "A high Q RF CMOS differential active inductor", *ICECS*, p. 157-160, 1998.
Yodprasit, U. et al., "Q-enhancing technique for RF CMOS active inductor", *ISCAS*, p. 589-592, 2000.
Lu, L.-H. et al., "A wide tuning range CMOS VCO with a differential tunable active inductor", *IEEE Transaction of Microwave Theory and Techniques*, p. 3462-3468, (54, 9), Sep. 2006.
Hsiao, C.-C et al., "Improved quality-factor of 0.18-um CMOS active inductor by a feedback resistance design", *IEEE Microwave and Wireless Components Letters*, (12, 12), p. 467-469, Dec. 2002.
Sackinger E. et al., "A 3-GHz 32-dB CMOS Limiting Amplifier for SONET OC-48 Receivers", *IEEE JSSC*, (35, 2) , p. 1884-1888, Dec. 2000.

* cited by examiner

*Primary Examiner* — Dean O Takaoka
*Assistant Examiner* — Alan Wong
(74) *Attorney, Agent, or Firm* — Baker Botts L.L.P.

(57) ABSTRACT

In one embodiment, a circuit, which comprises a resistor and a pMOS or cMOS transistor, has the characteristic of an inductor and produces an inductive impedance that operates over a substantially full range of a direct-current bias.

4 Claims, 6 Drawing Sheets

(a)

(b)

(c)

(d)

(a)

(b)

(a)

(b)

(c)

(d)

(e)

ACTIVE INDUCTOR

TECHNICAL FIELD

This disclosure generally relates to active inductors

BACKGROUND

An inductor, in general, is a passive electrical component that can store energy in a magnetic field created by the electric current passing through it. An inductor's ability to store magnetic energy is measured by its inductance (symbol "L"), in units of "henries" (symbol "H", named after American scientist Joseph Henry). Inductance results from the magnetic field forming around a current-carrying conductor, which tends to resist changes in the current. Electric current through the conductor creates a magnetic flux proportional to the current. A change in this current creates a corresponding change in magnetic flux which, in turn, by Faraday's Law generates an electromotive force (EMF) that opposes this change in current. Inductance is a measure of the amount of electromotive force generated per unit change in current. By definition, if the rate of change of current in a circuit is one ampere per second and the resulting electromotive force is one volt, then the inductance of the circuit is one henry.

DESCRIPTION OF EXAMPLE EMBODIMENTS

Inductors are one of the basic components used in electronics where current and voltage change with time due to the ability of inductors to delay and reshape alternating currents. The effect of an inductor in an electric circuit is to oppose changes in current through the circuit by developing a voltage across the circuit proportional to the rate of change of the current. The relationship between the time-varying voltage v(t) across an inductor with inductance L and the time-varying current i(t) passing through it is described by the differential equation:

$$v(t) = L \frac{d\,i(t)}{dt}. \tag{1}$$

There are many design variations for constructing inductors. For example, an inductor may be constructed as a coil of conducting material (e.g., copper wire) wrapped around a core either of air or of ferromagnetic or ferromagnetic material. As another example, when incorporated as a component of an integrated circuit (IC) where it is desirable that the size of the inductor is relatively small, a gyrator-based circuit, which uses a capacitor and other active components to transpose the capacitive impedance to an inductive one, behaves similarly as an inductor. Such circuits are called "active inductors" as they use active elements to create inductive impedance in a wide frequency range.

Figure 1:
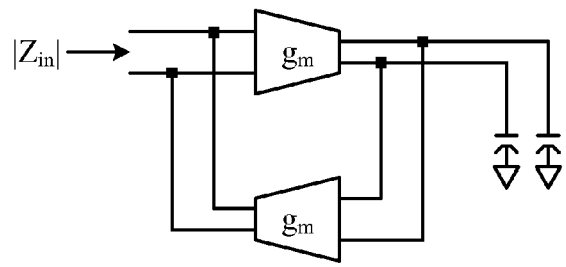
FIG. 1 illustrates several example active inductors implemented as gyrator-based circuits.
Figure 1:
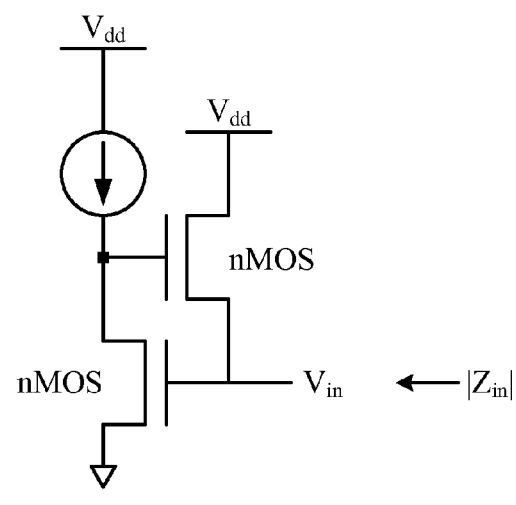
Figure 1:
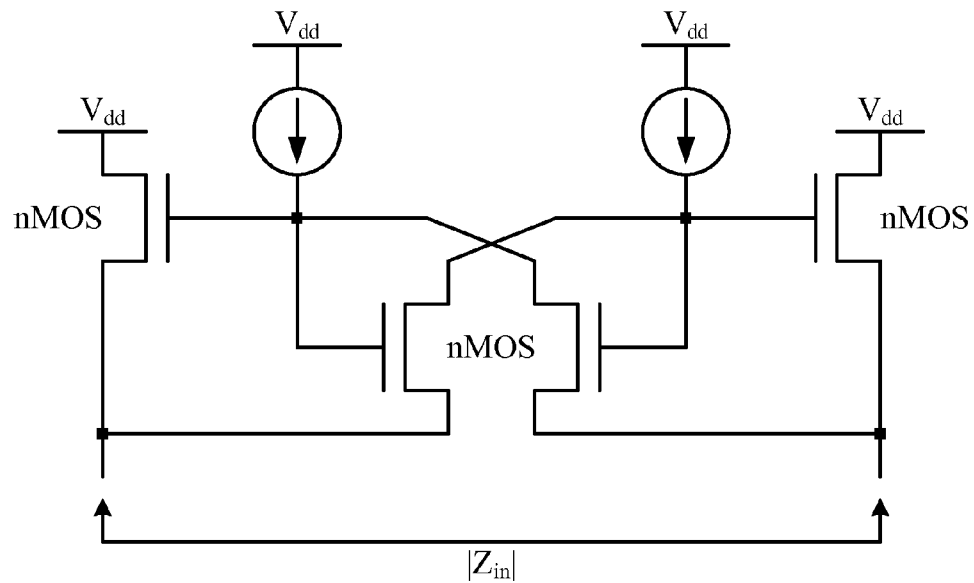
Figure 1:
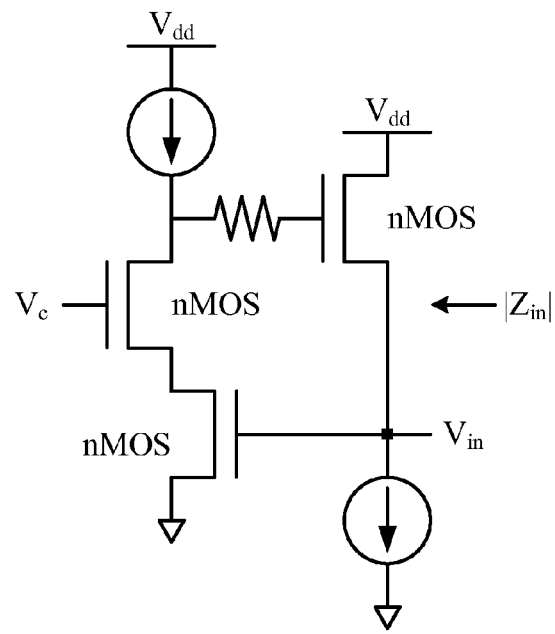

A gyrator is a passive, linear, lossless, two-port, and non-reciprocal electrical network element. An important property of a gyrator is that it inverts the current-voltage characteristics of an electrical component or network. In the case of linear elements, the impedance is also inverted. In other words, a gyrator can make a capacitive circuit behave inductively. FIG. 1 illustrates several example circuits that implement active inductors. More specifically, FIG. 1(a) illustrates an example gyrator-based circuit. FIG. 1(b) illustrates a single-ended, single-sided variation of the gyrator-based circuit illustrated in FIG. 1(a). FIGS. 1(c) and 1(d) illustrate two additional variations of the gyrator-based circuit. The principle of operation of this class of circuits is to integrate the input voltage by means of a trans-impedance amplifier that dumps the current on a capacitor (e.g., an explicit capacitor or a transistor gate capacitor), and transfer the obtained voltage through another trans-impedance amplifier back to the input, thus achieving the input current that is an integral of the input voltage (i.e., inductive behavior).

In each of the variation circuits illustrated in FIG. 1, $Z_{in}$ denotes the input impedance into the circuit in the direction indicated by the arrow, and $V_{dd}$ denotes the power supply. For example, for the circuits illustrated in FIGS. 1(a) and 1(b), the input impedance may be determined as:

$$Z_{in}(s) = \left( r_{ds2} \times g_{m1} \times g_{m2} + \frac{s \times C_{gs1}}{g_{m1} \times g_{m2}} \right) \Big\| \frac{1}{g_{m2}} \Big\| (s \times C_{gs2}). \tag{2}$$

FIG. 2(a) illustrates an example active inductor circuit commonly used for low-Q applications, and FIG. 2(b) illustrates the frequency characteristics of the input impedance of the circuit illustrated in FIG. 2(a). For the circuit illustrated in FIG. 2(a), a resistor is connected to the gate of a nMOS (n-type metal-oxide-semiconductor) transistor. A power supply is connected to the source of the nMOS transistor. In this case, the input impedance may be determined as:

$$Z_{in}(s) = R \times \frac{s + \frac{1}{R \times C_{gs}}}{s + \frac{g_m}{C_{gs}}}. \tag{3}$$

In EQUATION (3), R is the resistance of the resistor; $C_{gs}$ is the gate-to-source capacitance of the nMOS transistor; and $g_m$ is the transconductance of the nMOS transistor.

The circuit illustrated in FIG. 2(a) is simpler than the gyrator-based topology illustrated in FIG. 1. Moreover, it may be seen from the characteristic of its input impedance illustrated in FIG. 2(b) that if $$R > \frac{1}{g_m},$$

then the circuit behaves as an inductor above the frequency of the zero and the unity gain frequency of the transistor.

Figure 2:
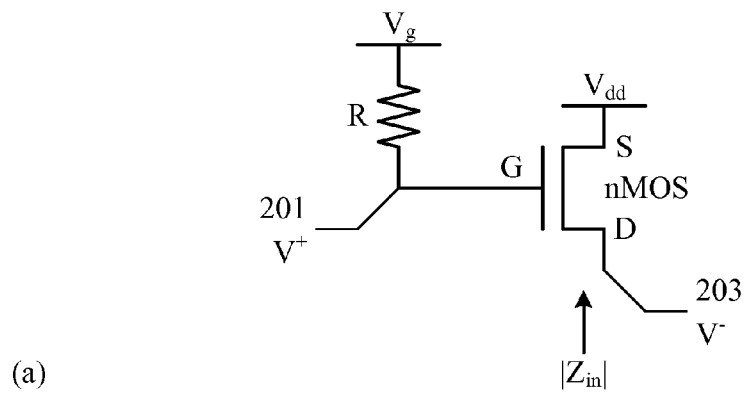
FIG. 2 illustrates an examples active inductor and the frequency characteristic of its input impedance.
Figure 2:
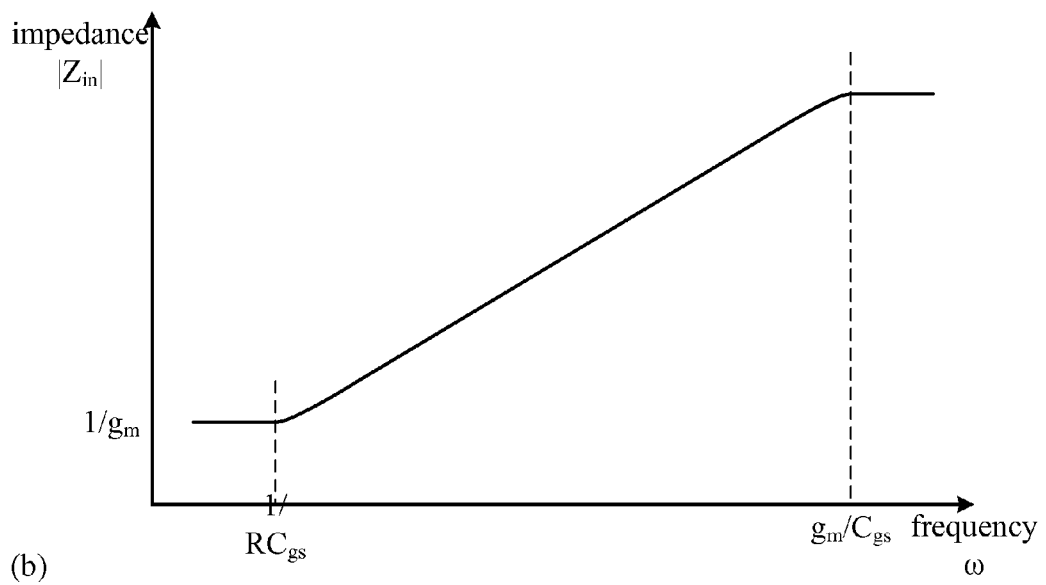

A common problem of the active inductors illustrated in FIGS. 1 and 2 is that the gate-source voltage of the transistor must exceed a threshold $V_t$, which either forces the gate supply voltage $V_g$ above the nominal power supply $V_{dd}$, or it limits the operating voltage of the active inductor to below $V_{dd}$-$V_t$. In either case, the practical usability of the circuit is greatly reduced. To further explain this problem with an example, consider the circuit illustrated in FIG. 2(a), if the voltage at location 201 is V⁺ and the voltage at location 203 is V⁻, then in order for there to be sufficient current in the circuit so that the circuit behaves similarly as an inductor, $V^+$-$V^-$ needs to be greater than $V_t$.

Figure 3:
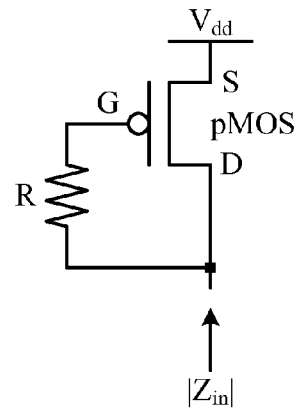
FIG. 3 illustrates several example active inductors where the inductive impedance is able to operate over substantially full range of direct current (DC) bias.
Figure 3:
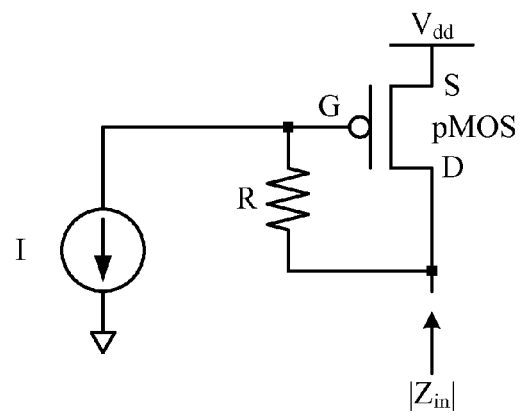
Figure 3:
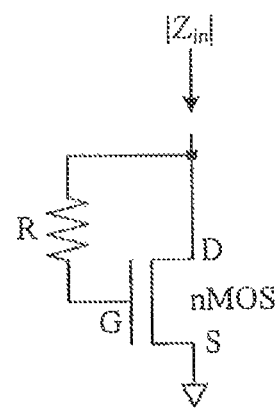
Figure 3:
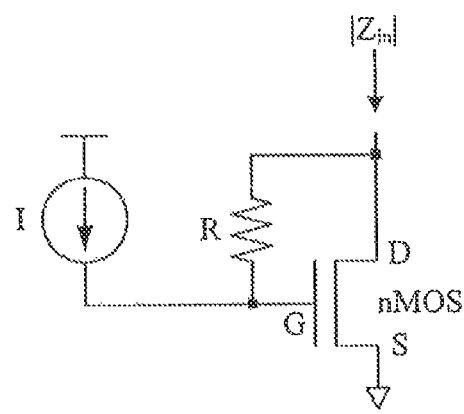
Figure 3:
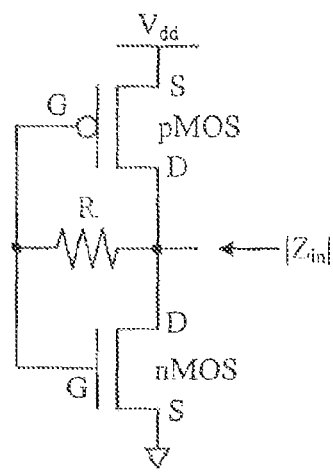

To overcome this problem, FIG. 3 illustrates several example circuits that have the characteristic of an inductor. Each of the illustrated circuits simulates the behavior of an inductor, as defined by EQUATION (1). The input impedance $Z_{in}$ may be determined using EQUATION (2). For each of these embodiments, the inductive impedance may operate over substantially full range of the direct current (DC) bias (i.e., 0 to $V_{dd}$) without using any additional power supply.

In the embodiment illustrated in FIG. 3(a), a resistor is connected to the drain and the gate, respectively, of a pMOS (p-type metal-oxide-semiconductor) transistor. A power supply is connected to the source of the pMOS transistor. In the embodiment illustrated in FIG. 3(b), a current source is added to the circuit illustrated in FIG. 3(a), which is also connected to the gate of the pMOS transistor and the resistor at one end, and to ground at the other end.

The embodiment illustrated in FIG. 3(c) is the nMOS circuit complementary to the pMOS circuit illustrated in FIG. 3(a), and has the same characteristic as the circuit illustrated in FIG. 3(a). In this case, a resistor is connected to the drain and the gate, respectively, of a nMOS transistor. The source of the nMOS transistor is connected to ground. In the embodiment illustrated in FIG. 3(d), a current source is added to the circuit illustrated in FIG. 3(c), which is also connected to the gate of the nMOS transistor and the resistor at one end, and to ground at the other end.

In the embodiment illustrated in FIG. 3(e), both a pMOS transistor and a nMOS transistor are used. This circuit is essentially the combination of the two circuits illustrated in FIGS. 3(a) and 3(c). A resistor is connected to the drain and the gate, respectively, of the pMOS transistor. The resistor is also connected to the drain and the gate, respectively, of the nMOS transistor. In addition, the drain of the pMOS transistor and the drain of the nMOS transistor are connected. The gate of the pMOS transistor and the gate of the nMOS transistor are connected. A power supply is connected to the source of the pMOS transistor. The source of the nMOS transistor is connected to ground.

Herein, reference to a computer-readable storage medium encompasses one or more non-transitory, tangible computer-readable storage media possessing structure. As an example and not by way of limitation, a computer-readable storage medium may include a semiconductor-based or other integrated circuit (IC) (such, as for example, a field-programmable gate array (FPGA) or an application-specific IC (ASIC)), a hard disk, an HDD, a hybrid hard drive (HHD), an optical disc, an optical disc drive (ODD), a magneto-optical disc, a magneto-optical drive, a floppy disk, a floppy disk drive (FDD), magnetic tape, a holographic storage medium, a solid-state drive (SSD), a RAM-drive, a SECURE DIGITAL card, a SECURE DIGITAL drive, or another suitable computer-readable storage medium or a combination of two or more of these, where appropriate. Herein, reference to a computer-readable storage medium excludes any medium that is not eligible for patent protection under 35 U.S.C. §101. Herein, reference to a computer-readable storage medium excludes transitory forms of signal transmission (such as a propagating electrical or electromagnetic signal per se) to the extent that they are not eligible for patent protection under 35 U.S.C. §101. A computer-readable non-transitory storage medium may be volatile, non-volatile, or a combination of volatile and non-volatile, where appropriate.

This disclosure contemplates one or more computer-readable storage media implementing any suitable storage. In particular embodiments, a computer-readable storage medium implements one or more portions of processor ~02 (such as, for example, one or more internal registers or caches), one or more portions of memory ~04, one or more portions of storage ~06, or a combination of these, where appropriate. In particular embodiments, a computer-readable storage medium implements RAM or ROM. In particular embodiments, a computer-readable storage medium implements volatile or persistent memory. In particular embodiments, one or more computer-readable storage media embody software. Herein, reference to software may encompass one or more applications, bytecode, one or more computer programs, one or more executables, one or more instructions, logic, machine code, one or more scripts, or source code, and vice versa, where appropriate. In particular embodiments, software includes one or more application programming interfaces (APIs). This disclosure contemplates any suitable software written or otherwise expressed in any suitable programming language or combination of programming languages. In particular embodiments, software is expressed as source code or object code. In particular embodiments, software is expressed in a higher-level programming language, such as, for example, C, Perl, or a suitable extension thereof. In particular embodiments, software is expressed in a lower-level programming language, such as assembly language (or machine code). In particular embodiments, software is expressed in JAVA, C, or C++. In particular embodiments, software is expressed in Hyper Text Markup Language (HTML), Extensible Markup Language (XML), or other suitable markup language.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated otherwise by context.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative.

What is claimed is:
1. A circuit comprising:
a pMOS transistor having a source, a drain, and a gate, wherein the source of the pMOS transistor connects with a power supply;
a nMOS transistor having a source, a drain, and a gate, wherein the drain of the nMOS transistor connects with the drain of the pMOS transistor, the gate of the nMOS transistor connects with the gate of the pMOS transistor, and the source of the nMOS transistor connects with ground;

a resistor having a first end and a second end, wherein the first end of the resistor connects with the gate of the pMOS transistor and the gate of the nMOS transistor, and the second end of the resistor connects with the drain of the pMOS transistor and the drain of the nMOS transistor; and a voltage input connected to the drain of the nMOS transistor and the drain of the pMOS transistor.

2. The circuit of claim 1, wherein the circuit has characteristic of an inductor and produces an inductive impedance.

3. The circuit of claim 1, wherein the circuit produces an inductive impedance that operates over a substantially full range of a direct-current bias.

4. The circuit of claim 3, wherein the direct-current bias is between 0 volt and a voltage of the power supply.

* * * * *